United States Patent
Sakurai

(10) Patent No.: US 7,554,403 B1
(45) Date of Patent: Jun. 30, 2009

(54) GAINBOOST BIASING CIRCUIT FOR LOW VOLTAGE OPERATIONAL AMPLIFIER DESIGN

(75) Inventor: Satoshi Sakurai, San Diego, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/038,225

(22) Filed: Feb. 27, 2008

(51) Int. Cl.
*H03F 3/45* (2006.01)
(52) U.S. Cl. .................. 330/260; 330/278; 330/254
(58) Field of Classification Search ............. 330/260, 330/278, 254
See application file for complete search history.

(56) References Cited

U.S. PATENT DOCUMENTS

| | | | |
|---|---|---|---|
| 3,986,060 A * | 10/1976 | Nishizawa et al. | 327/581 |
| 6,064,267 A * | 5/2000 | Lewyn | 330/288 |
| 6,326,846 B1 * | 12/2001 | Brandt | 330/253 |
| 6,667,660 B2 * | 12/2003 | Schrodinger et al. | 330/289 |
| 6,961,546 B1 * | 11/2005 | Rofougaran et al. | 455/118 |
| 7,075,373 B2 * | 7/2006 | Briskin et al. | 330/298 |
| 7,262,664 B1 * | 8/2007 | Joffe et al. | 330/260 |
| 7,368,993 B2 * | 5/2008 | Beffa | 330/277 |

* cited by examiner

Primary Examiner—Patricia Nguyen

(57) ABSTRACT

Bias current generation circuits and systems are disclosed. In one embodiment, a gain boosting cascode system comprises a cascode based on a transconductance amplifier and a current buffer and a gain booster circuit coupled to the cascode optimally boosting a gain of the cascode by maintaining the transconductance amplifier and the current buffer in their respective saturation regions. The gain booster circuit is based on one or more feedback amplifiers coupled in series with a main voltage control transistor. The main voltage control transistor is maintained in a triode region, and the voltage at the drain of the main voltage control transistor can be set by passing an appropriate amount of current through the main voltage control transistor. This in turn would keep the transconductance amplifier and the current buffer in their respective saturation regions, thus generating the optimal gain for the gain boosted cascode system.

20 Claims, 5 Drawing Sheets

GAINBOOST BIASING CIRCUIT FOR LOW VOLTAGE OPERATIONAL AMPLIFIER DESIGN

FIELD OF TECHNOLOGY

This disclosure relates generally to a bias generation circuit and system.

BACKGROUND

FIG. 1 illustrates a differential amplifier with conventional gain booster circuit. The first gain boosted cascode of the circuit is implemented by introducing a feedback transistor M3 to a cascode consisting of a common source transistor M1 associated with a negative input 102 and a common gate transistor M2. The second gain boosted cascode of the circuit is implemented by introducing a feedback transistor M3' to a cascode consisting of a common source transistor M1' associated with a positive input 104 and a common gate transistor M2'.

As illustrated in FIG. 1, the sources of the common source transistors M1 and M1' are coupled to a tail current source realized by a bias voltage source $V_{bias0}$ biasing a tail transistor M0 to generate a tail current 110. A positive output node 106, which is coupled to the drain of the common gate transistor M2, is coupled to a current source $I_1$ and a negative output node 108, which is coupled to the drain of the common gate transistor M2', is coupled to a current source $I_1'$. Since the number of cascodes is limited by the supply voltage Vdd, the feedback transistors M3 and M3' are introduced to the cascode circuit to generate an additional gain. The gain boosted cascodes illustrated in FIG. 1 boosts the gain of the cascode circuit by increasing its output impedance (e.g., by the gain of the feedback transistor M3 or M3').

In FIG. 1, the sources of the feedback transistors M3 and M3' are coupled to the ground, and their drains are coupled to current sources $I_2$ and $I_{2'}$, respectively. This layout becomes problematic as the size of transistors is getting smaller. If a typical transistor with the minimum channel length of 0.12 um is implemented as the feedback transistor, the gate to source voltage becomes very small since the threshold voltage is very small in such device. In that case, the voltage at the drain of the source transistor M1 or M1' (e.g., 0.3 volt) is not big enough to keep the tail current 110 in saturation mode as the tail transistor M0 and/or the common source transistor M1 is placed in the triode region. This may result in the substantial decrease in the gain which can be realized by the gain booster circuit if the components were maintained in the saturation mode.

FIG. 2 illustrates a differential amplifier with another example of conventional gain booster circuit. In this example, instead of connecting the source of the feedback transistors M3 to the ground, the source is connected to a tail current via a tail transistor M4 after the feedback transistor M3 is paired with a matching transistor M5. The gate of the matching transistor M5 is coupled to a voltage source $V_{bias5}$, and the drain of the matching transistor M5 is connected to a current source $I_3$. The tail current via the tail transistor M4 is biased by a voltage source $V_{bias4}$. Thus, a desired voltage at the drain of the common source transistor M1 can be obtained by setting the voltage sources $V_{bias4}$ and/or $V_{bias5}$. The same arrangement is made to the right side of the symmetrical circuit as illustrated in FIG. 2.

To operate the gain boosted cascodes illustrated in FIG. 2, the sum of the drain to source voltage of the tail transistor M4 and the gate to source voltage of the feedback transistor M3 and the drain to source voltage of the common gate transistor M2 needs to be less than the voltage at a positive output voltage node 206. It is common for a typical positive supply voltage $V_{dd}$ being 1.65 volts to 1.8 volts to split among stacked devices which are represented by the current source $I_1$. The stacked devices may be 3 PMOS transistors stacked or the second stage of the differential amplifier. In such a case, the positive output voltage may be set at 0.75 volts.

However, the voltage at the source terminal of the feedback transistor M3 needs to be 200 mV or higher to maintain the tail transistor M4 in saturation mode. Then, it would be hard to keep the voltage at the source terminal of the common gate transistor M2, which is the sum of the drain to source voltage of the tail transistor M4 and the gate to source voltage of the feedback transistor M3, low enough to maintain the drain to source voltage of the common gate transistor M2 in saturation mode. This would result in the loss of gain. The same goes for the right side of the symmetrical circuit as illustrated in FIG. 2.

To sum it up, if the source terminal of the feedback amplifier M3 or M3' is grounded, the small drain to source voltage of the common source transistor M1 or M1' decreases the gain of the gain boosted cascode circuit. Conversely, if the source terminal of the feedback amplifier M3 or M3' is connected to its own tail current source, the small drain to source voltage of the common gate transistor M2 or M2' decreases the gain of the gain boosted cascode circuit.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a gain boosted cascode system comprising a cascode based on a transconductance amplifier and a current buffer and a gain booster circuit coupled to the cascode optimally boosting a gain of the cascode by maintaining the transconductance amplifier and the current buffer in their respective saturation regions. The gain booster circuit is based on one or more feedback amplifiers coupled in series with a main voltage control transistor. The main voltage control transistor is maintained in a triode region, and the voltage at the drain of the main voltage control transistor can be set by passing an appropriate amount of current through the main voltage control transistor. This in turn would keep the transconductance amplifier and the current buffer in their respective saturation regions, thus generating the optimal gain for the gain boosted cascode system.

As illustrated in the detailed description, other embodiments pertain to electronic circuits and systems that optimally boost the gain of a cascode by supplying a bias voltage which maintains the components of the cascode in the saturation region. The bias voltage is obtained based on a transistor which is kept at a triode region such that an appropriate amount of the bias voltage can be generated by varying the amount of current flowing through the transistor.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Briefly stated, embodiments optimally boost the gain of a cascode by supplying a bias voltage which maintains the components of the cascode in the saturation region. Particularly, a transistor which is kept at its triode region is used to generate the bias voltage such that an appropriate amount of the bias voltage can be obtained by varying the amount of current flowing through the transistor.

Figure 1:
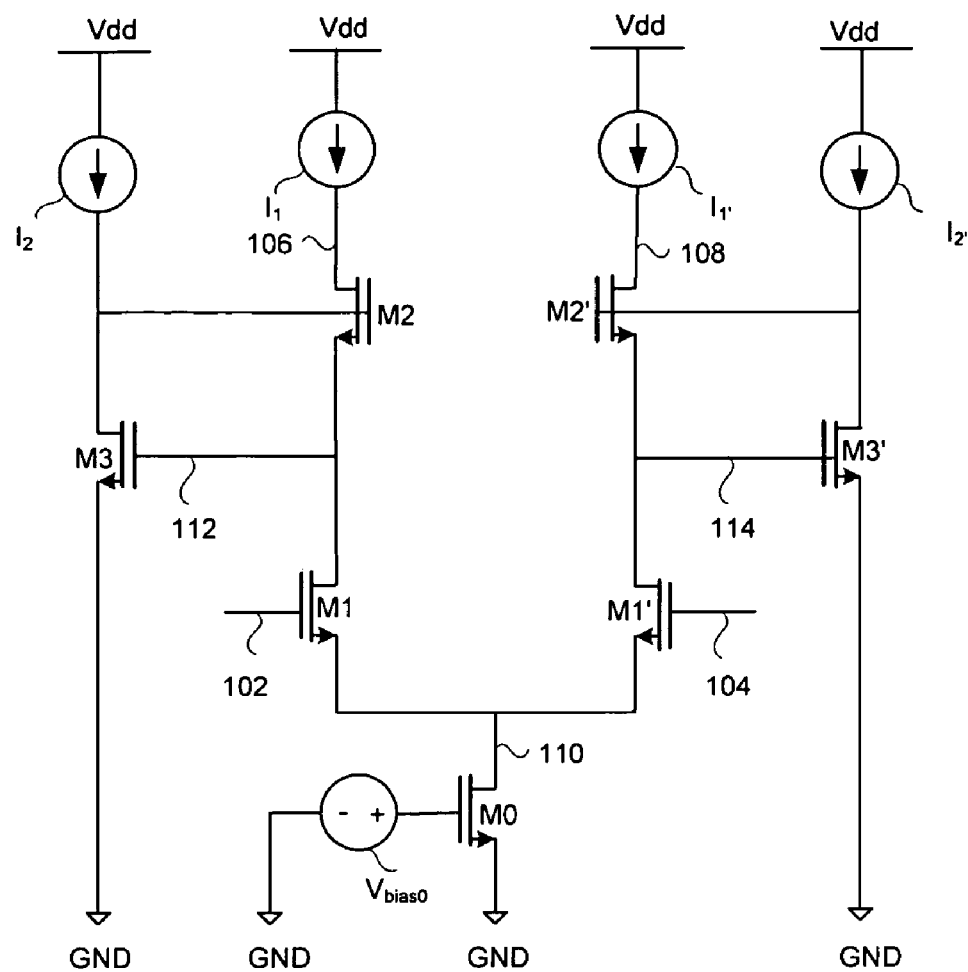
FIG. 1 illustrates a differential amplifier with a conventional gain booster circuit.
Figure 2:
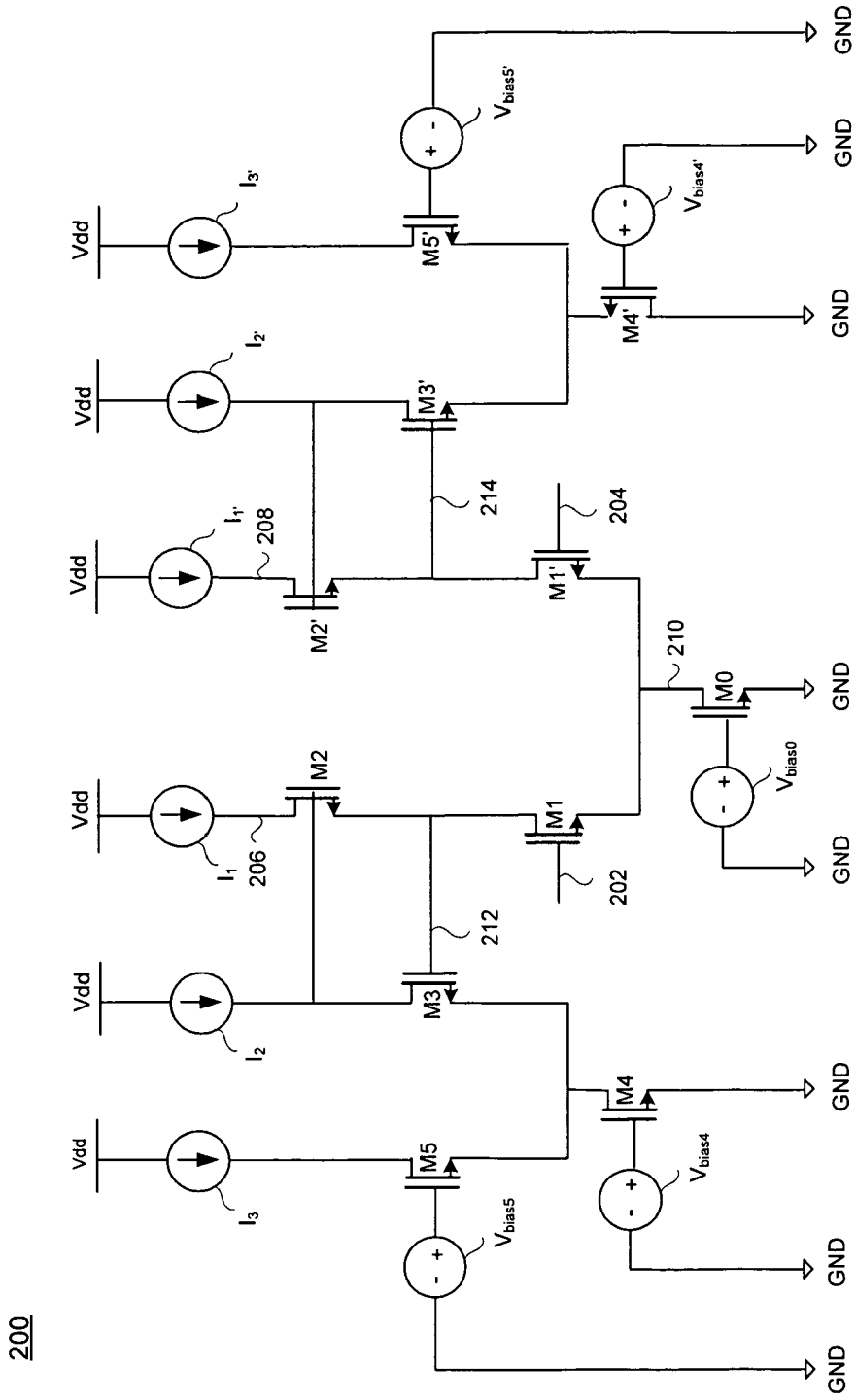
FIG. 2 illustrates a differential amplifier with another example of conventional gain booster circuit.
Figure 3:
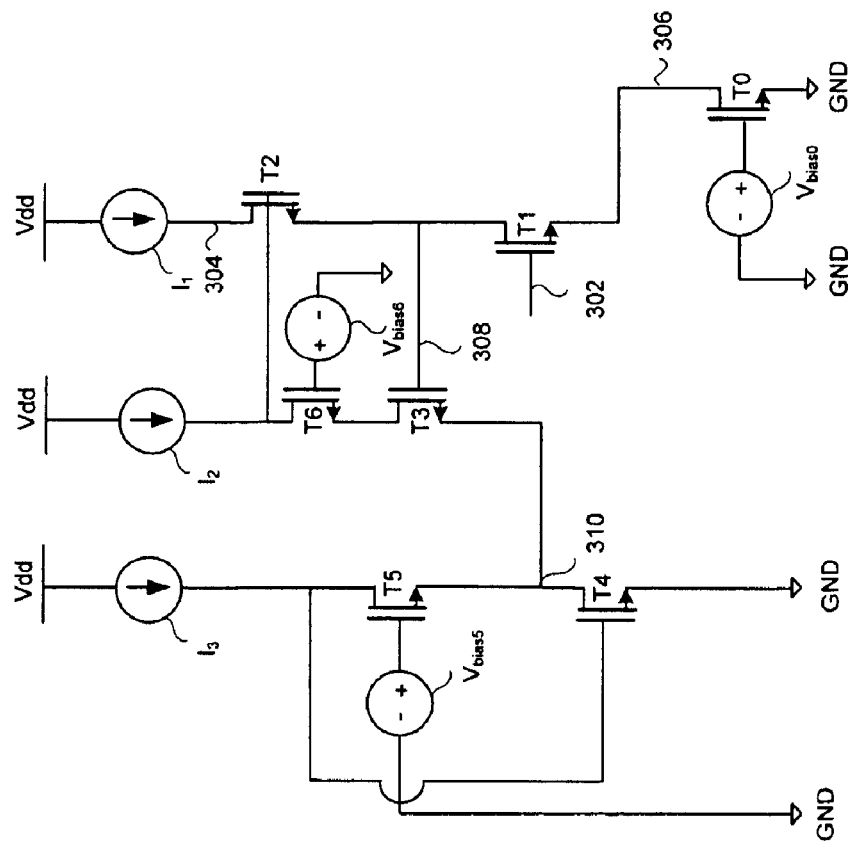
FIG. 3 is an exemplary circuit diagram of a gain boosting cascode system, according to one embodiment.

FIG. 3 is an exemplary circuit diagram of a gain boosting cascode system, according to one embodiment. In one exemplary embodiment, the gain boosting cascode system 300 comprises a cascode based on a transconductance amplifier T1 (e.g., a common source transistor) and a current buffer T2 (e.g., a common gate transistor) and a gain booster circuit coupled to the cascode optimally boosting a gain of the cascode by maintaining the transconductance amplifier T1 and the current buffer T2 in their respective saturation regions. The gain booster circuit is based on one or more feedback amplifiers (e.g., T3, T6, etc.) coupled in series with a main voltage control transistor T4. The main voltage control transistor T4 is maintained in a triode region, and the voltage at the drain of the main voltage control transistor T4 can be set by passing an appropriate amount of current through the main voltage control transistor T4. This would keep the transconductance amplifier T1 and the current buffer T2 in their respective saturation regions, thus generating the optimal gain for the gain boosting cascode system 300.

The gain boosting cascode system 300 further comprises a tail current source coupled to the transconductance amplifier T1, wherein the tail current source is based on a transistor T0 biased by a voltage source $V_{bias0}$. The transistor T0 is maintained in saturation mode for the optimum gain of the gain boosting cascode system 300. As illustrated in FIG. 3, the transconductance amplifier T1, the current buffer T2, the feedback amplifiers (e.g., T3, T6, etc.) or the main voltage control transistor T4 may be based on single NMOS transistor. Alternatively, each of the components may be implemented with a PMOS transistor.

In FIG. 3, the drain of the transconductance amplifier T1 coupled to the source of the current buffer T2, the drain of the last one of the feedback amplifiers (e.g., T6) to the gate of the current buffer T2 and the gate of the first one of the feedback amplifiers (e.g., T3) to the drain of the transconductance amplifier T1. In addition, the drain of the main voltage control transistor T4 is coupled to the source of the first one of the feedback amplifiers, and the source of the main voltage control transistor T4 coupled to the ground GND.

The gate of the transconductance amplifier T1 is an input node 302, and the drain of the current buffer T2 is an output node 304 coupled to a first current source $I_1$. The drain of the last one of the feedback amplifiers is coupled to a second current source $I_2$. The system further comprises an auxiliary voltage control transistor T5 biased by a voltage source $V_{bias5}$, wherein the source of the auxiliary voltage control transistor T5 is coupled to the drain of the main voltage control transistor T4 and where the drain of the auxiliary voltage control transistor T5 is coupled to a third current source $I_3$.

The gate of the main voltage control transistor T4 is coupled to the drain of the auxiliary voltage control transistor T5 to maintain the main voltage control transistor T4 in the triode region. The second current source $I_2$, the third current source $I_3$ or the voltage source $V_{bias5}$ is adjusted to obtain a particular voltage at the drain of the main voltage control transistor T4.

Figure 4:
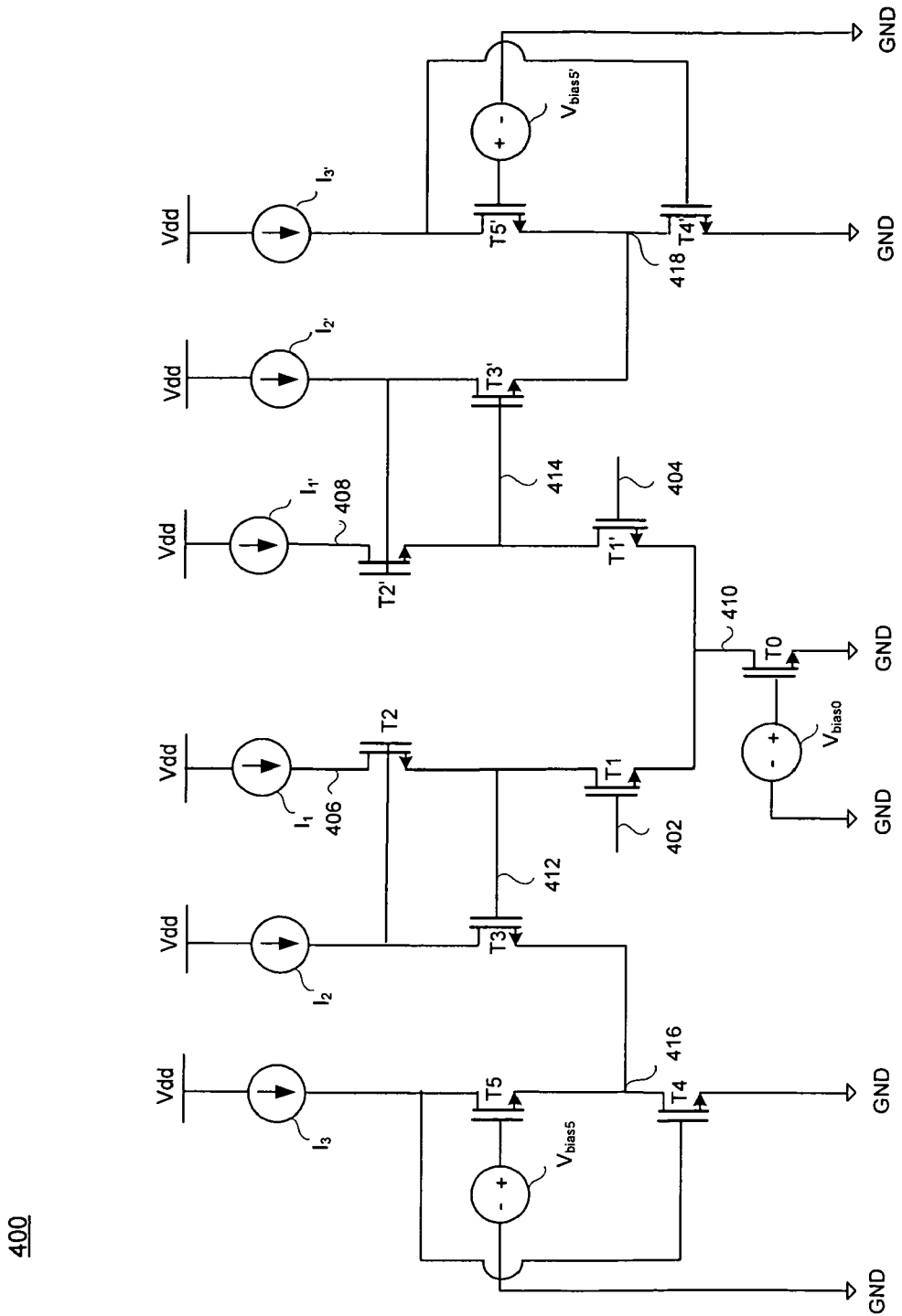
FIG. 4 is an exemplary circuit diagram of a differential amplifier with a symmetrical booster circuit, according to one embodiment.

FIG. 4 is an exemplary circuit diagram of a differential amplifier with a symmetrical booster circuit, according to one embodiment. In FIG. 4, a transistor T1 and a transistor T1' of a differential amplifier amplifies a positive input 402 and a negative input 404, respectively. The transistors T1 and T1' are common source transistors (e.g., NMOS, PMOS, etc.) which work as transconductance devices. The transistors T1 and T1' are coupled to transistors T2 and T2', respectively. The transistors T2 and T2' are common gate transistors (e.g., NMOS, PMOS, etc.) which work as current buffers. The cascode of transistors T1 and T2 is coupled to a current source $I_1$, which is coupled to a positive power supply (e.g., $V_{dd}$). The cascode of transistors T1' and T2' is coupled to a current source $I_{1'}$, which is coupled to a positive power supply (e.g., $V_{dd}$). In addition, the two transistors T1 and T1' of the differential amplifier are coupled to a tail current source which comprises a tail transistor T0 biased by a bias voltage $V_{bias0}$.

The gates of feedback transistors T3 and T3' are coupled to the sources of the common source transistors T2 and T2', respectively and to the drains of the common gate transistors T1 and T1', respectively. The drains of the feedback transistors T3 and T3' are coupled to the gates of the common gate transistors T2 and T2', respectively and to current sources $I_2$ and $I_{2'}$, respectively. The current sources $I_2$ and $I_{2'}$ are coupled to the positive power supply (e.g., $V_{dd}$). The sources of the feedback transistors T3 and T3' are coupled to the sources of auxiliary voltage control transistors T5 and T5' (e.g., NMOS, PMOS, etc.) and to the drains of main voltage control transistors T4 and T4' (e.g., NMOS, PMOS, etc.).

The gates of the auxiliary voltage control transistors T5 and T5' are coupled to voltage sources $V_{bias5}$ and $V_{bias5'}$, respectively, and they are maintained in the saturation region. The drains of the auxiliary voltage control transistors T5 and T5' are coupled to current sources $I_3$ and $I_{3'}$, respectively. The gates of the main voltage control transistors T4 and T4' are coupled to the drains of the auxiliary voltage control transistors T5 and T5'. The sources of the main voltage control transistors T4 and T4' are coupled to the ground GND.

In one exemplary embodiment, the main voltage control transistors T4 and T4' are maintained in a triode region to perform like a resistor. Accordingly, the drain voltages of the main voltage control transistors T4 and T4' can be adjusted by varying the amount of current through the main voltage transistors T4 and T4'.

In one exemplary embodiment, the drain voltages of the main voltage control transistors T4 and T4' are configured based on the gate to source voltages of the main voltage control transistors T4 and T4' as well as the source to drain voltages of the main voltage control transistors T4 and T4'.

In one exemplary embodiment, the gate terminals of the main voltage control transistors T4 and T4' are coupled to the drain terminals of the auxiliary voltage control transistors T5 and T5' to make the source to drain voltages or the drain to source voltages of the main voltage control transistors T4 and T4' to be small enough to keep the main voltage control transistors T4 and T4' in the triode region.

In one exemplary embodiment, the voltages at the drain terminals of the main voltage control transistors T4 and T4' (e.g., which are the source terminals of the auxiliary voltage control transistors T5 and T5' or the source terminals of the feedback transistors T3 and T3') can be adjusted by varying the amounts of currents flowing from the second current sources $I_2$ and $I_{2'}$, and/or the third current sources $I_3$ and $I_{3'}$. In one exemplary embodiment, the individual voltage at the drain terminals of the main voltage control transistors T4 and T4' ranges between 50 millivolts and 150 millivolts.

By adjusting the drain voltages of the main voltage control transistors T4 and T4' at an appropriate level, the common source transistors T1 and T1', the common gate transistors T2 and T2' and the transistor T0 are placed in the saturation region, thus optimally boosting the voltage gain at a positive output node 406 and at a negative output node 408.

Figure 5:
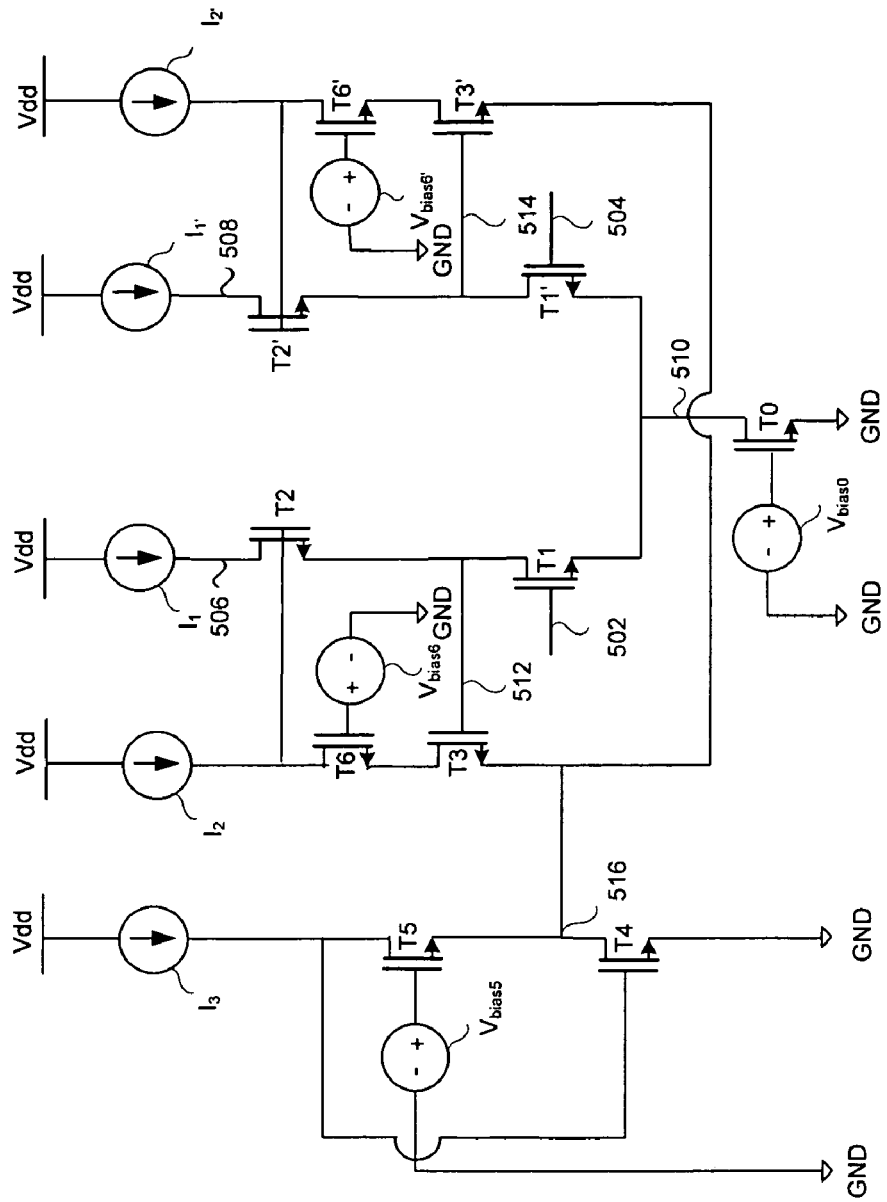
FIG. 5 is an exemplary circuit diagram of a gain boosting differential amplifier, according to one embodiment.

FIG. 5 is an exemplary circuit diagram of a gain boosting differential amplifier 500, according to one embodiment. In FIG. 5, the gain boosting differential amplifier 500 includes common source transistors T1 and T1', common gate transistors T2 and T2', a tail transistor T0, feedback transistors (e.g., T3, T3', T6 and T6'), a main voltage control transistor T4, an auxiliary voltage control transistor T5, current sources $I_1$, $I_{1'}$, $I_2$, $I_{2'}$, and $I_3$, and voltage sources $V_{bias0}$, $V_{bias5}$, $V_{bias6}$ and $V_{bias6'}$ as described in FIG. 4.

The sources of the feedback transistors T3 and T3' are coupled to the source of the auxiliary voltage control transistor T5 (e.g., NMOS, PMOS, etc.) and to the drain of main voltage control transistor T4 (e.g., NMOS, PMOS, etc.). The gate of the auxiliary voltage control transistors T5 is coupled to the voltage source $V_{bias5}$, and is maintained in the saturation region. The drain of the auxiliary voltage control transistor T5 is coupled to the current source $I_3$. The gate of the main voltage control transistor T4 is coupled to the drain of the auxiliary voltage control transistor T5. The source of the main voltage control transistor T4 is coupled to the ground.

It is appreciated that the auxiliary voltage control transistor T5, the main voltage control transistor T4 and the rest of the components in FIG. 5 operate in a similar manner as the differential amplifier in FIG. 4. However, the voltage at the drain terminal of the main voltage control transistor T4 (e.g., which is also the voltage at the source terminal of the auxiliary voltage control transistor T5) is directly coupled to both the sources of the feedback transistors T3 and T3'. This is preferable to the differential amplifier with the symmetrical gain booster circuit as illustrated in FIG. 4 since there is no difference between the voltage at the drain terminal of the main voltage control transistor T4 and the voltage at the drain terminal of the main voltage control transistor T4'. Moreover, the die space may be saved by implementing fewer components for the gain booster circuit in FIG. 5 than for the gain booster circuit in FIG. 4.

In addition, one or more feedback transistors (e.g., T3 and T6 or T3' or T6') are implemented to the gain booster circuit which is coupled to each leg of the differential amplifier. The multiple feedback amplifiers may generate more gain than the gain booster circuits in FIG. 4 which has only one feedback amplifier on each leg of the differential amplifier. The feedback transistors T6 and T6' are biased by voltage sources $V_{bias6}$ and $V_{bias6'}$.

In one exemplary embodiment, the gain boosted differential amplifier 500 comprises a differential amplifier comprising the first transconductance amplifier T1 and the second transconductance amplifier T1', the first current buffer T2 coupled to the first transconductance amplifier T1 and the second current buffer T2' coupled to the second transconductance amplifier T1'. The gain boosted differential amplifier 500 further comprises a first gain booster circuit coupled to the connecting node of the first transconductance amplifier T1 and the first current buffer T2, where the first gain booster circuit comprises one or more feedback amplifiers (e.g., the first feedback amplifier T3) and the main voltage control transistor T4 and where the main voltage control transistor T4 is maintained to operate in the triode region. The gain boosted differential amplifier 500 further comprises a second gain booster circuit coupled to the connecting node of the second transconductance amplifier T1' and the second current buffer T2', where the second gain booster circuit comprises one or more feedback amplifiers (e.g., the second feedback amplifier T3') and the main voltage control transistor T4.

A tail current source may be coupled to the differential amplifier. A positive input 502 may be fed to the first transconductance amplifier T1 and a negative input 504 may be fed to the second transconductance amplifier T1'. A positive output 506 may be forwarded by the first current buffer T2 and a negative output 508 may be forwarded by the second current buffer T2'. The auxiliary voltage control transistor T5 is coupled to the main voltage control transistor T4, where the auxiliary voltage control transistor T5 is biased by a voltage source $V_{bias5}$. The target voltage at the connecting node of the first transconductance amplifier T1 and the first current buffer T2 and/or the target voltage at the connecting node of the second transconductance amplifier T1' and the second current buffer T2' may be set based on the effective resistance of the main voltage control transistor T4 since the target voltage can be configured by varying a current flowing through the main voltage control transistor T4.

In summary, embodiments described herein pertain to electronic circuits and systems that optimally boost the gain of a cascode by supplying a bias voltage which maintains the components of the cascode in the saturation region. The bias voltage is obtained based on a transistor which functions as a resistor such that an appropriate amount of the bias voltage can be configured by passing an appropriate amount of current through the transistor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A gain boosted cascode system, comprising:
    a cascode based on a transconductance amplifier and a current buffer; and
    a gain booster circuit coupled to the cascode optimally boosting a gain of the cascode by maintaining the transconductance amplifier and the current buffer in respective saturation regions,
        wherein the gain booster circuit is based on at least one feedback amplifier coupled in series with a main voltage control transistor;
        wherein the main voltage control transistor is maintained in a triode region; and
        wherein the maintaining the transconductance amplifier and the current buffer in the respective saturation regions is performed through passing an appropriate amount of current through the main voltage control transistor.

2. The system of claim 1, further comprising a tail current source coupled to the transconductance amplifier, wherein the tail current source is based on a transistor biased by a voltage source.

3. The system of claim 1, wherein transconductance amplifier comprises a common source transistor.

4. The system of claim 1, wherein the current buffer comprises a common gate transistor.

5. The system of claim 1, wherein each of the transconductance amplifier, the current buffer, the at least one feedback amplifier and the main voltage control transistor is based on single NMOS transistor.

6. The system of claim 5, wherein a drain of the transconductance amplifier is coupled to a source of the current buffer, wherein a drain of a last one of the at least one feedback amplifier is coupled to a gate of the current buffer and a gate of a first one of the at least one feedback amplifier coupled to the drain of the transconductance amplifier, and wherein a drain of the main voltage control transistor is coupled to a source of the first one of the at least one feedback amplifier and a source of the main voltage control transistor coupled to a ground.

7. The system of claim 6, wherein a gate of the transconductance amplifier is an input node, wherein a drain of the current buffer is an output node coupled to a first current source, and wherein the drain of the last one of the at least one feedback amplifier is coupled to a second current source.

8. The system of claim 7, further comprising an auxiliary voltage control transistor biased by a voltage source, wherein a source of the auxiliary voltage control transistor is coupled to the drain of the main voltage control transistor and wherein a drain of the auxiliary voltage control transistor is coupled to a third current source.

9. The system of claim 8, wherein a gate of the main voltage control transistor is coupled to the drain of the auxiliary voltage control transistor to maintain the main voltage control transistor in the triode region.

10. The system of claim 9, wherein the second current source, the third current source or the voltage source is adjusted to obtain a particular voltage at the drain of the main voltage control transistor.

11. A gain boosted cascode circuit, comprising:
    a cascode of a transconductance amplifier and a current buffer coupled to a ground via a tail current source and to a positive supply voltage via a first current source; and
    a gain booster circuit boosting a gain of the cascode comprising:
        a feedback amplifier coupled to the transconductance amplifier, to the current buffer and to the positive supply voltage via a second current source; and
    a main voltage control transistor coupled to the feedback amplifier,
        wherein a drain to source voltage and a gate to source voltage of the main voltage control transistor is configured to maintain the main voltage control transistor in a triode region.

12. The circuit of claim 11, further comprising an auxiliary voltage control transistor coupled to the main voltage control transistor and to a third current source, wherein the auxiliary voltage control transistor is biased by a voltage source.

13. The circuit of claim 12, wherein a voltage at the drain of the main voltage control transistor is set by varying an amount of current from the second current source, an amount of current from the third current source or an amount of voltage from the voltage source.

14. A gain boosted differential amplifier, comprising:
    a differential amplifier comprising a first transconductance amplifier and a second transconductance amplifier;
    a first current buffer coupled to the first transconductance amplifier and a second current buffer coupled to the second transconductance amplifier,
    a first gain booster circuit coupled to a connecting node of the first transconductance amplifier and the first current buffer,
        wherein the first gain booster circuit comprises a first feedback amplifier and a main voltage control transistor; and
        wherein the main voltage control transistor is maintained to operate in a triode region; and
    a second gain booster circuit coupled to a connecting node of the second transconductance amplifier and the second current buffer,
        wherein the second gain booster circuit comprises a second feedback amplifier and the main voltage control transistor.

15. The differential amplifier of claim 14, further comprising a tail current source coupled to the differential amplifier.

16. The differential amplifier of claim 14, wherein a positive input is fed to the first transconductance amplifier and a negative input is fed to the second transconductance amplifier and wherein a positive output is forwarded by the first current buffer and a negative output is forwarded by the second current buffer.

17. The differential amplifier of claim 14, further comprising an auxiliary voltage control transistor coupled to the main voltage control transistor, wherein the auxiliary voltage control transistor is biased by a voltage source.

18. The differential amplifier of claim 17, wherein a target voltage at the connecting node of the first transconductance amplifier and the first current buffer or a target voltage at the connecting node of the second transconductance amplifier and the second current buffer is set based on an effective resistance of the main voltage control transistor.

19. The differential amplifier of claim 18, wherein the target voltage is configured by varying a current flowing through the main voltage control transistor.

20. The differential amplifier of claim 19, wherein the target voltage ranges between 50 millivolts and 150 millivolts.

* * * * *